United States Patent [19]
Tohyama

[11] Patent Number: 5,710,447
[45] Date of Patent: Jan. 20, 1998

[54] SOLID STATE IMAGE DEVICE HAVING A TRANSPARENT SCHOTTKY ELECTRODE

[75] Inventor: Shigeru Tohyama, Tokyo, Japan

[73] Assignee: NEC Corporation, Tokyo, Japan

[21] Appl. No.: 549,435

[22] Filed: Oct. 27, 1995

[30] Foreign Application Priority Data

Oct. 27, 1994  [JP]  Japan ................... 6-263745

[51] Int. Cl.$^6$ ............... H01L 31/07; H01L 31/108; H01L 27/148
[52] U.S. Cl. ............ 257/230; 257/229; 257/249; 257/445; 257/455; 257/456
[58] Field of Search ................... 257/230, 249, 257/229, 445, 455, 456

[56] References Cited

U.S. PATENT DOCUMENTS

5,565,676  10/1996  Tanabe ................... 257/455

FOREIGN PATENT DOCUMENTS

0410465  1/1991  European Pat. Off. .......... 257/230
61-287166  12/1986  Japan .

OTHER PUBLICATIONS

Y. Kitahama et al., "½ Inch 270,000 Elements CCD Image Devices with High Sensitivity", *ITEJ Technical Report* 13(11): 61–66 (1989).

*Primary Examiner*—Jerome Jackson
*Attorney, Agent, or Firm*—Foley & Lardner

[57] ABSTRACT

Disclosed is a solid state image device which has a plurality of photosensitive units which are disposed in parallel with each other and each of which includes a row of a plurality of photosensitive devices each of which includes a first N(or P)-type impurity region which is selectively formed on the surface of a P(or N)-type semiconductor region at the surface of a semiconductor substrate, a CCD register for executing electronic scanning which is disposed in parallel to the row of photosensitive devices, and a read-out gate in which a signal charge is transferred from the photosensitive device to the CCD register, wherein a transparent Schottky electrode is formed on the first N(or P)-type impurity region except a portion adjacent to the read-out gate region, the Schottky electrode is electrically connected to a P$^+$ (or N$^+$)-type element separating region which surrounds the first N(or P)-type impurity region and has a Schottky barrier that is determined such that a diffusion potential between the Schottky electrode and the first N(or P)-type impurity region is lower than a diffusion potential between the first N(or P)-type impurity region and the P(or N)-type semiconductor region.

7 Claims, 7 Drawing Sheets

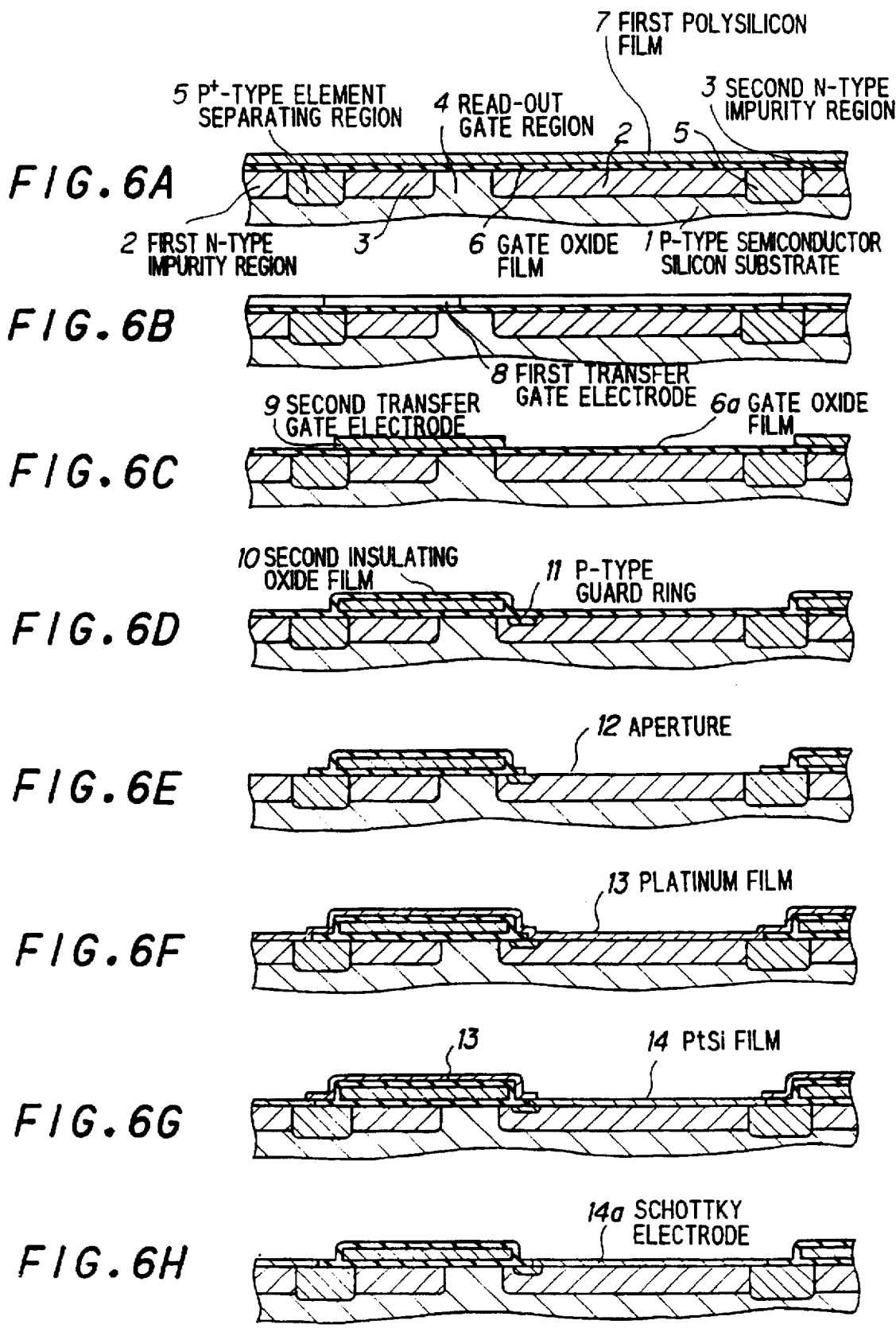

SOLID STATE IMAGE DEVICE HAVING A TRANSPARENT SCHOTTKY ELECTRODE

FIELD OF THE INVENTION

This invention relates to a solid state image device for outputting two-dimensional image information as a time series of electrical signals, and more particularly to, a solid state image device that comprises a semiconductor.

BACKGROUND OF THE INVENTION

A conventional solid state image device is, for example, disclosed in Japanese patent application laid-open No.61-287166 (hereinafter referred to as "first prior art") and in the article "½ inch 270,000 elements CCD image devices with high sensitivity", ITEJ Technical Report vol.13, No.11, pp.61–66(1989) (hereinafter referred to as "second prior art").

The solid state image device in the first prior art is characterized in that the blooming is inhibited by the overflow drain in the Schottky diode formed in each photosensitive device (pixel). Herein, the blooming means a phenomenon that when an excess signal charge is generated by receiving an intense light to the photodiode (pixel), the photodiode is put into a forward bias state during the accumulating mode, thereby the excess signal charge leaks into the adjacent vertical CCD.

However, in the first prior art, there is a problem in that the opening area of the photodiode must be narrow since the overflow drain is formed inside the surface of the photodiode. Though the problem is a little improved in the second embodiment of the first prior art, the overflow drain area occupying an inside surface of the photodiode is not completely deleted.

The solid state image device in the second prior art is characterized in that the photodiode has a structure of a $P^+NP^-N$ multilayer in the direction of the depth of the semiconductor substrate which can inhibit blooming.

However, in the second prior art, there is a problem in that the structure is complex and it is quite difficult to fabricate to have a specific potential distribution in the deep portion of the substrate since the overflow drain has to be provided by forming the multilayer in the direction of the depth of the substrate.

SUMMARY OF THE INVENTION

Accordingly, it is an object of the invention to provide a solid state image device in which the blooming can be inhibited while obtaining a wide opening in each photodiode.

It is a further object of the invention which can provide a solid state image device which has a simple structure to be easily fabricated.

It is a still further object of the invention to provide a solid state image device in which generation of a dark current can be reduced.

According to the invention, a solid state image device includes:

a plurality of photosensitive units which are disposed in parallel with each other and each of which includes a row of a plurality of photosensitive devices each of which includes a first N(or P)-type impurity region which is selectively formed on the surface of a P(or N)-type semiconductor region at the surface of a semiconductor substrate means for executing electronic scanning which is disposed in parallel to the row of photosensitive devices, and a read-out gate in which a signal charge is transferred from the photosensitive device to the means for electronic scanning;

wherein a transparent Schottky electrode is formed on the first N(or P)-type impurity region except a portion adjacent to the read-out gate region, the Schottky electrode is electrically connected to a $P^+$(or $N^+$)-type element separating region which surrounds the first N(or P)-type impurity region and has a Schottky barrier that is determined such that a diffusion potential between the Schottky electrode and the first N(or P)-type impurity region is lower than a diffusion potential between the first N(or P)-type impurity region and the P(or N)-type semiconductor region.

Further, a P(or N)-type guard ring is preferably formed just under and in the vicinity of an edge portion of the Schottky electrode so that the edge portion of the Schottky electrode is not in contact with the first N(or P)-type impurity region.

According to another aspect of the invention, a solid state image device includes:

a plurality of photosensitive units which are disposed in parallel with each other and each of which includes a row of a plurality of photosensitive devices each of which includes a first N(or P)-type impurity region which is selectively formed on the surface of a P(or N)-type semiconductor region at the surface of a semiconductor substrate, means for executing electronic scanning which is disposed in parallel to the row of photosensitive devices, and a read-out gate in which a signal charge is transferred from the photosensitive device to the means for electronic scanning;

wherein a P(or N)-type impurity region is formed on the first N(or P)-type impurity region except a first portion adjacent to the read-out gate region, the P(or N)-type impurity region is connected to a $P^+$(or $N^+$)-type element separating region which surrounds the first N(or P)-type impurity region, and a transparent Schottky electrode is formed on the first N(or P)-type impurity region except a second portion greater than the portion adjacent to the read-out gate region, the Schottky electrode is electrically connected to the $P^+$(or $N^+$)-type element separating region which surrounds the first N(or P)-type impurity region and has a impurity concentration and thickness in the P(or N)-type impurity region that are determined such that a diffusion potential between the Schottky electrode and the first N(or P)-type impurity region is lower than a diffusion potential between the first N(or P)-type impurity region and the P(or N)-type semiconductor region.

Herein, the means for executing electric scanning may be a CCD register which comprises a first channel layer formed by a second N(or P)-type impurity region that is selectively formed on the surface of the P(or N)-type semiconductor substrate, and a plurality of transfer gate electrodes to the respective photosensitive devices which are attached through gate oxide film on the first channel layer, and the read-out gate may comprise a second channel layer formed by a semiconductor substrate region between the first channel layer and the first N-type impurity region, and a read-out gate electrode which is attached through the gate oxide film on the second channel layer.

The Schottky electrode is preferably metal silicide film.

In accordance with the invention, since the Schottky barrier $\Phi_{SB}$ is determined such that a diffusion potential $V_{D1}$ between the Schottky electrode and the first N(or P)-type impurity region is lower than a diffusion potential $V_{D2}$ between the first N(or P)-type impurity region and the P(or N)-type semiconductor region, a signal charge accumulated in the photosensitive device can be overflown to the P⁺(or N⁺)-type element separating region.

The Schottky electrode can be formed as very thin film by the deposition method in a vacuum state with a pressure of less than $10^{-4}$ Pa. It has good light transmissivity even when it covers the entire surface of the said first N(or P)-type impurity region.

Also, a dark current can be sufficiently reduced since the interface level in the Schottky structure that is made carefully is significantly low.

An electrostatic focusing, which may occur at the edge portion of the Schottky electrode, can be prevented by forming the P(or N)-type guard ring just under and in the vicinity of the edge portion of the Schottky electrode.

In accordance with another aspect of the invention, the Schottky electrode is formed on the P(or N)-type impurity region on the first N(or P)-type impurity region. This type of a solid state image device can provide a barrier potential $V_b$ that can be optionally set by changing the impurity concentration and thickness of the P(or N)-type impurity region, whereas the previous solid state image device can provide a given diffusion potential depending on the material of a the Schottky electrode.

The Schottky electrode may be film of a single metal element, and it is preferably metal silicide film which can afford excellent interface and is thermally stable. Herein, the Schottky electrode can be formed by forming an aperture in gate oxide film, forming metal film by the deposition method in a vacuum state with a pressure of less than $10^{-4}$ Pa, making silicide by heat treatment and removing unreacted metal by selectively etching.

BRIEF DESCRIPTION OF THE DRAWINGS

The invention will be explained in more detail in conjunction with the appended drawings, wherein:

FIGS. 6A to 6H are cross sectional views showing a method for making a solid state image device in the first embodiment according to the invention.

DESCRIPTION OF THE PREFERRED EMBODIMENTS

Before explaining a solid state image device in the preferred embodiment, the aforementioned conventional solid state image device will be explained below.

Figure 1:
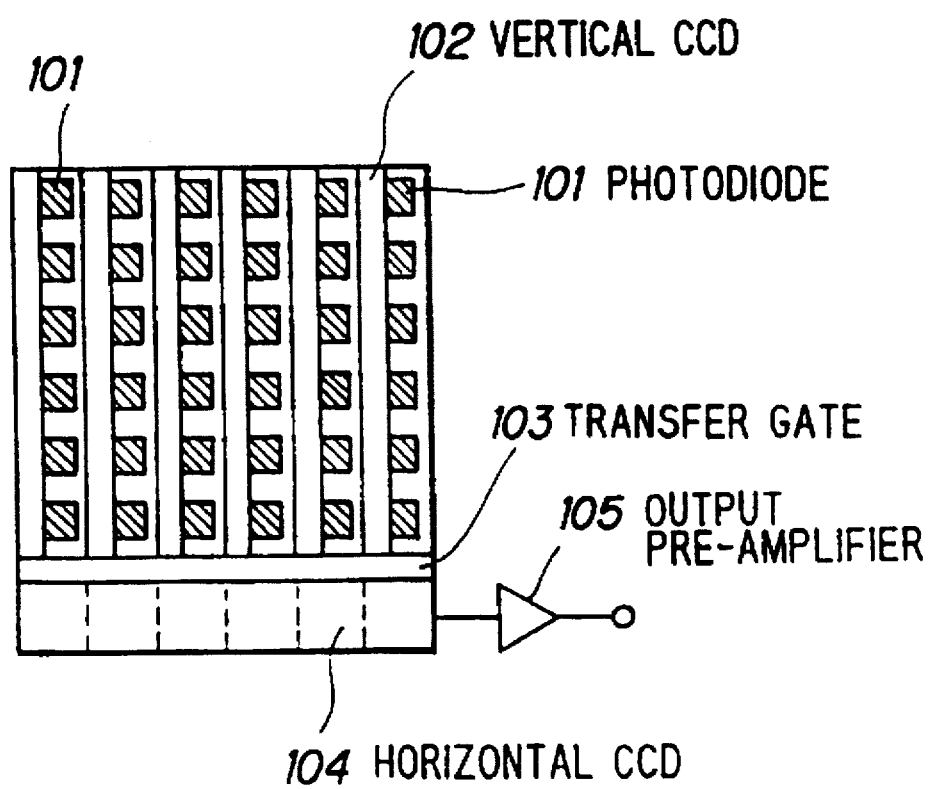
FIG. 1 is a block diagram showing the composition of a conventional solid state image device.
Figure 2A:
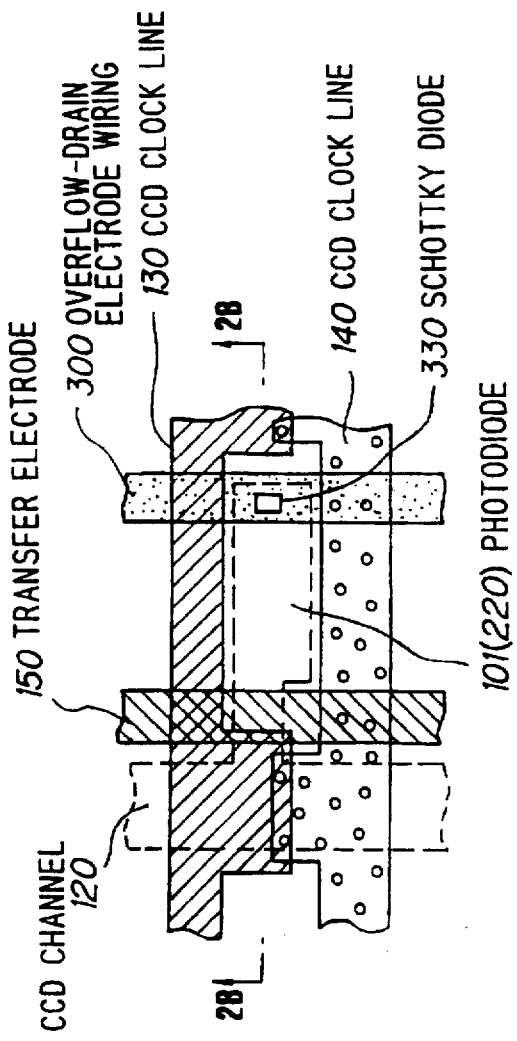
FIG. 2A is a plan view showing a photosensitive device in the first prior art.
Figure 2B:
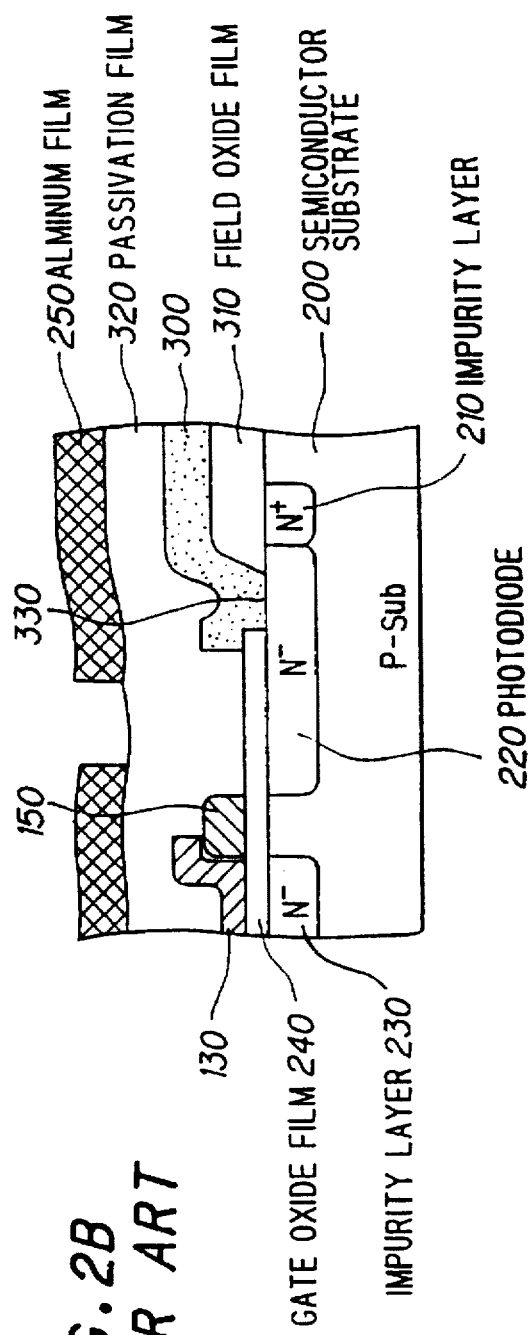
FIG. 2B is a cross sectional view cut along the line 2B—2B in FIG. 2A.

First, the solid state image device in the first prior art will be explained with reference to FIGS. 1 to 3. FIG. 1 is a block diagram showing the whole composition of the solid state image device, FIG. 2A is a plan view showing a photosensitive device in the solid state image device, and FIG. 2B is a cross sectional view cut along the line 2B—2B in FIG. 2A. A CCD channel 120 is formed through a N⁻ impurity layer 220 forming a photodiode 101, and through a transfer electrode 150. By controlling the potential of the transfer electrode 150, a signal charge accumulated in the photodiode 220 is transferred to the CCD channel 120. An overflow drain electrode wiring 300 is formed on the opposite side of the CCD channel 120, and a Schottky diode 330 is constructed by connecting the photodiode impurity layer 220 with the electrode wiring 300. In the cross section, N⁻ impurity layers 220 and 230 which form the photodiode and the CCD channel 120, respectively, and a N⁺ impurity layer 210 (which should be corrected into a P⁺ impurity layer, but it is explained here as it is) which forms a channel stopper are formed on the surface of a P-type semiconductor substrate 200. Also, a control electrode 150 is formed over between the N⁻ impurity layers 220 and 230 through gate oxide film 240. A CCD clock line 130 is formed over the N⁻ impurity layer 230. The overflow drain electrode wiring 300 is formed on the N⁻ impurity layer 220. The electrode wiring 300 is an aluminum layer and is connected with the N⁻ impurity layer 220 to form the Schottky diode 330. Aluminum film 250 as a photoshield is formed on passivation film 320. Accordingly, such photosensitive devices are disposed two-dimensionally as shown in FIG. 1 to form the solid state image device, wherein horizontal CCD's 104 are provided through a transfer gate 103 below the ends of vertical CCD's 102 and output pre-amplifier 105 is connected to the output of the horizontal CCD's 104.

In operation, when a pulse signal is applied to the control electrode 150, the photodiode 101 is set into an initial bias state. Then, the control electrode 150 is turned off, and the photodiode 101 goes into an accumulating mode at the bias state. When light is received by the photodiode 101, a signal charge is generated, being accumulated in the photodiode 101, at the same time the bias state being changed. After the accumulation period, the control electrode 150 is turned on to read out the signal charge to the vertical CCD 102 as well as to set the photodiode 101 into the initial bias state. Then, the control electrode 150 is turned off and the photodiode 101 returns to the accumulating mode to carry out the photoelectric conversion. One horizontal line of the signal charge transferred to the vertical CCD 102 is then transferred to the horizontal CCD 104 and is subsequently read out through the pre-amplifier 105. Thereafter, the next horizontal line is transferred to the horizontal CCD 104 to be read out. By repeating the above procedures, the signal charges corresponding to all the photodiodes are output as time series signals.

In the first prior art, since the Schottky diode 330, which has a diffusion potential lower than that of the P-N junction that comprises the photodiode 101, is formed by the N⁻ impurity layer 220, the Schottky diode 330 can be put into a forward bias state before the photodiode 101 is put in the forward bias state to overflow the excess charge to the overflow drain electron wiring 300 to inhibit the blooming.

Figure 3:
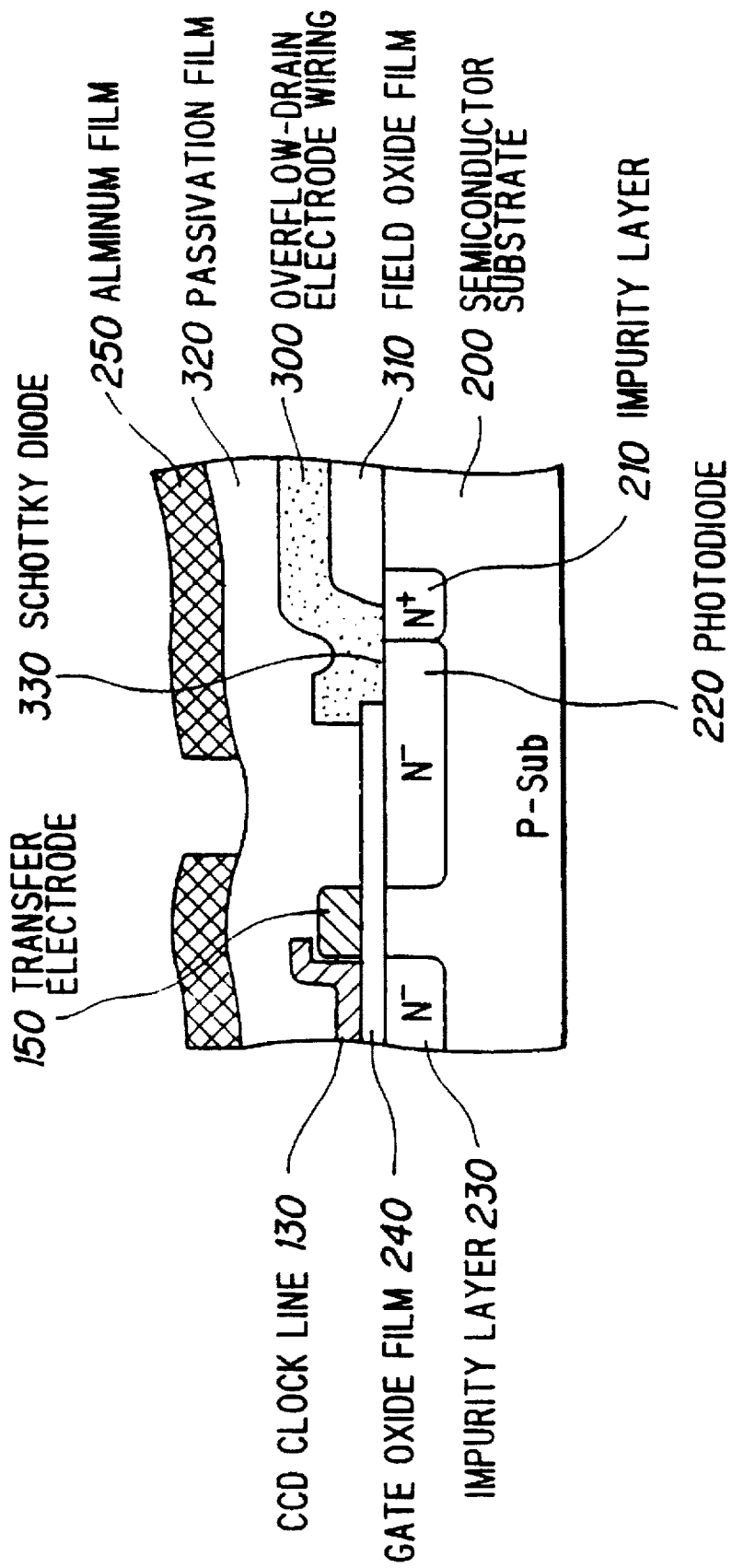
FIG. 3 is a cross sectional view showing a photosensitive device of another embodiment in the first prior art.

FIG. 3 is a cross sectional view showing a photosensitive device in another embodiment in the first prior art. This embodiment is different from the previous embodiment in that the overflow drain electrode wiring 300 is in contact with the N⁺ impurity layer 210 for a channel stopper as well as the N⁻ impurity layer 220 for the photodiode 101 to form a Schottky diode 330. By such Schottky diode structure extending to the channel stopper region, the opening part of the photodiode can be widened, and the interval for arranging the photodiode can be shortened.

Figure 4A:
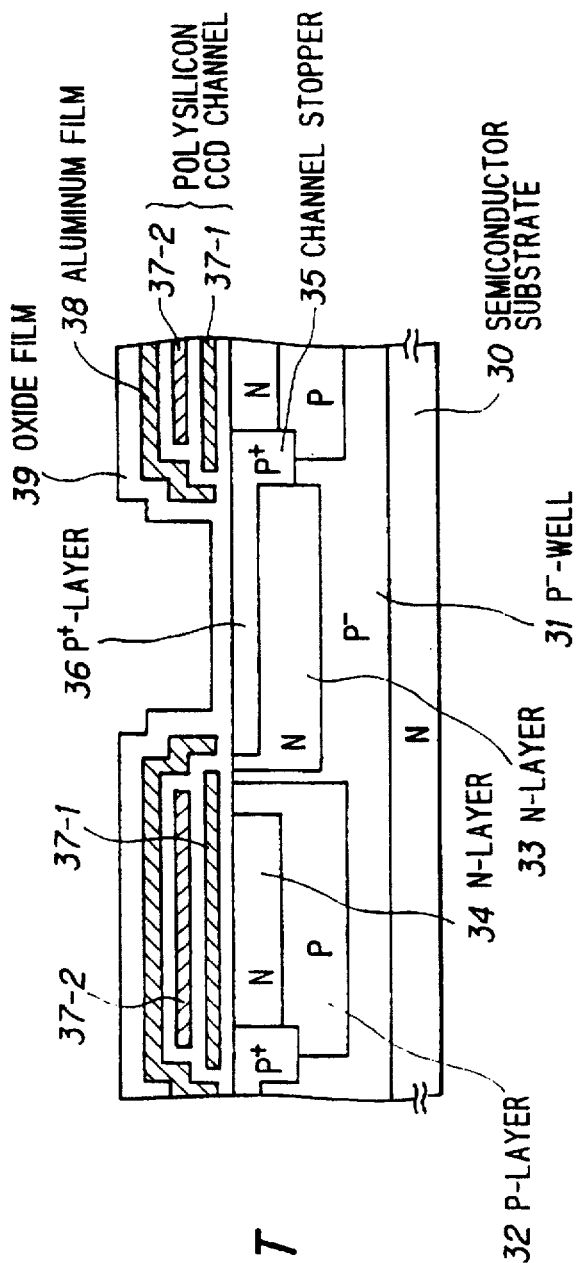
FIG. 4A is a cross sectional view showing a photosensitive device in the second prior art.

The solid state image device in the second prior art will be explained with reference to FIGS. 4A and 4B. FIG. 4A is a cross sectional view showing a photosensitive device in the solid image device. A P⁻-well 31 is formed on the surface of a N-type semiconductor substrate 30. Further, N-layers 33 and 34 which serve as a photodiode and CCD channel, respectively are formed thereon. A P-layer 32, which has an impurity concentration greater than the P⁻ layer to prevent the depletion, is formed around the N-layer 34. Between N-layers 33 and 34, a P⁺ channel stopper 35 is formed. Hereon, though, in FIG. 4A, the P⁺ channel stopper 35 appears only at one of the N-layers since a read-out portion for reading out a charge from the photodiode to the CCD channel is included in the cross section, it is actually formed at both of the N-layers in the cross section where the read-out portion is not included. A P⁺-layer 36 extending from the P⁺ channel stopper 35 is formed between the N-layer 33 and oxide film 39. Over the CCD channel 34, polysilicon CCD electrodes 37-1 and 37-2 and aluminum photoshield film 38 are formed.

In operation, the procedures that a signal charge is accumulated in the photodiode and is transferred to the CCD channel is similar to those in the first prior art.

Figure 4B:
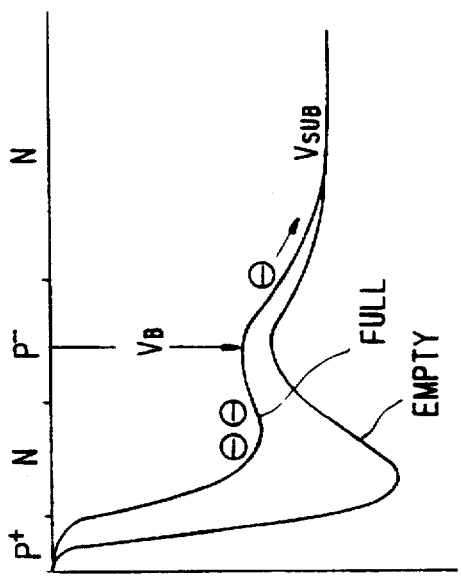
FIG. 4B is a graph showing a potential distribution in the direction of the depth of the photosensitive device in the second prior art.

FIG. 4B is a graph showing a potential distribution in the direction of the depth of the photodiode. Herein, a vertical overflow drain is formed by the NPN structure, and an empty state and a full state where an excess charge overflows into in the substrate is shown. In operation, a reverse bias voltage $V_{SUB}$ is applied between the P⁻-well 31 and the N-type substrate 30, and the P⁻-well 31 is completely depleted and a potential thereof is deepened. In the initial stage, at the moment when a signal charge is read out from the photodiode to the CCD channel, the N-layer and P⁻-well of the photodiode is put in a reverse bias state. As the charge is accumulated by the photoelectric conversion, the potential in the photodiode changes from empty to full state. When the potential in the P⁻-well reaches $V_B$ as determined by $V_{SUB}$, the N-layer and P⁻-well of the photodiode is put in a forward bias state to overflow the excess charge into the N-type substrate to inhibit the blooming. Furthermore, in this solid state image device, the P⁺-layer 36 is formed on the interface between the photodiode and the oxide film to reduce a dark current. If the P⁺-layer 36 is not formed, the interface is depleted and a charge is thermally generated through the interface level existing thereon when the N-layer of the photodiode is depleted. This charge is a dark current component and is detected as a noise. Thus, due to the P⁺-layer, the interface that is the center for generation of the dark current is, as shown in FIG. 4B, always kept at a reference potential and is in the non-depleted state to reduce the generation of the dark current. Due to the P⁺-layer, the dark heat noise can be taken about one figure down.

Figure 5A:
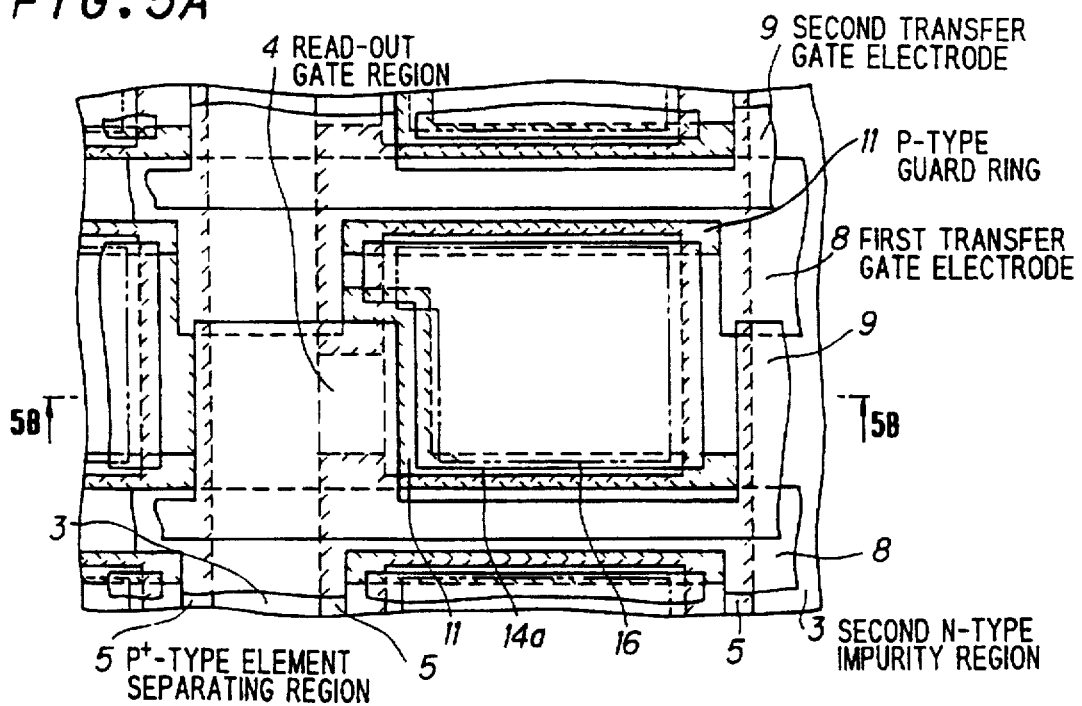
FIG. 5A is a plan view showing a photosensitive device in a first embodiment according to the invention.
Figure 5B:
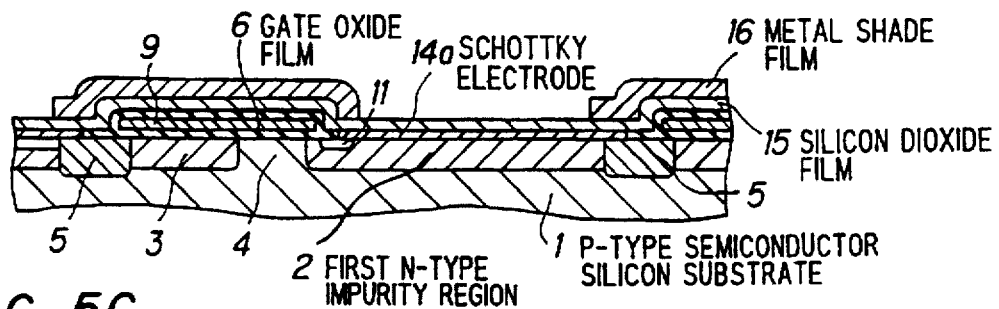
FIG. 5B is a cross sectional view cut along the line 5B—5B in FIG. 5A.
Figure 5C:
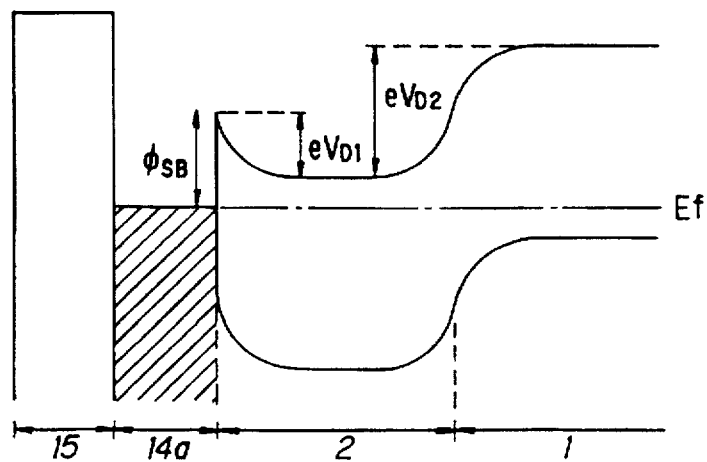
FIG. 5C is an energy band diagram in the direction of the depth of photosensitive device in the first embodiment according to the invention.

Next, a solid state image device in the first preferred embodiment will be explained in reference to FIGS. 5A to 5C. Herein, FIG. 5A is a plan view showing a photosensitive device of the two-dimensional CCD solid state image device, while the whole composition of the solid state image device is similar to that in FIG. 1. FIG. 5B is a cross sectional view cut along the line 5B—5B in FIG. 5A. FIG. 5C is a graph showing energy bands in a photosensitive device in the direction of the depth of a substrate.

The solid state image device in the first embodiment comprises: a plurality of photosensitive units which are disposed in parallel with each other and each of which includes a row of a plurality of photosensitive devices (photodiodes) each of which includes a first N-type impurity region 2 which is selectively formed on a P-type semiconductor silicon substrate 1, means for executing electronic scanning (CCD transfer register) which is disposed in parallel to the row of photosensitive devices, and a read-out gate (read-out gate region 4 and second transfer electrode 9) in which signal charge is transferred from the photosensitive device to the CCD transfer register;

wherein a transparent Schottky electrode is formed on the first N-type impurity region 2 except a portion adjacent to the read-out gate region 4, the Schottky electrode is electrically connected to a P⁺-type element separating region 5 which surrounds the first N-type impurity region 2 and has a Schottky barrier $\Phi_{SB}$ that is determined such that a diffusion potential $V_{D1}$ between the Schottky electrode and the first N-type impurity region is lower than a diffusion potential $V_{D2}$ between the first N-type impurity region 2 and the P-type semiconductor substrate 1.

Herein, the means for executing electric scanning is preferably a CCD register (corresponding to the vertical CCD 102) which comprises a first channel layer formed by a second N-type impurity region 3 that is selectively formed on the P-type semiconductor silicon substrate 1, and two transfer gate electrodes (first transfer gate electrode 8 and second transfer gate electrode 9) to the respective photosensitive devices which are attached through gate oxide film 6 on the first channel layer. The read-out gate comprises a second channel layer (read-out channel region 4) formed by a part of the semiconductor substrate 1 between the first channel layer and the first N-type impurity region, and a read-out gate electrode (the second transfer gate electrode 9 also serves as the read-out gate electrode) which is attached through the gate oxide film 6 on the second channel layer.

A method for making a solid state image device in the first embodiment will be explained in reference to FIGS. 6A to 6H.

First, as shown in FIG. 6A, by implanting phosphorus or boron ions to the surface of P-type semiconductor silicon substrate 1 and applying heat treatment thereto, the first N-type impurity region 2 in the form of a matrix, the second N-type impurity region 3 in the form of a band which is disposed in the direction of a column between the first N-type impurity regions 2, and the P⁺-type element separating region 5 between the first and second N-type impurity regions 2 and 3 except the read-out gate region 4 are formed. Next, after the gate oxide film 6 is formed on the entire surface of the semiconductor silicon substrate 1, a first polysilicon film 7 is deposited by a CVD method. Thereafter, by adding phosphorus to the first polysilicon film 7 by a diffusion method and patterning the first polysilicon film 7, as shown in FIG. 6B, the first transfer gate electrode 8 (not appearing in the cross section in FIG. 6B but clearly shown in FIG. 5A) which covers a first portion of the second N-type impurity region 3 which is not adjacent to the read-out gate region 4 and extends to the direction of a row is formed. By the thermal oxidation after the gate oxide film 6 is removed by using the first transfer gate electrode 8 as a mask, the first transfer gate electrode 8 is covered with first insulating oxide film (not shown) while gate oxide film 6a is again formed on the region where the gate oxide film 6 is removed (FIG. 6C). Then, depositing second polysilicon film by a CVD method on the entire surface, adding high-concentration phosphorus by the diffusion method and patterning, the second transfer gate electrode 9 which covers a second portion of the second N-type impurity region 3 except the first portion and the read-out gate region 4 and the vicinity (or the second portion) and extends to the direction of a row is formed. Thereafter, as shown in FIG. 6D, the second transfer gate electrode 9 is covered by second insulating oxide film 10. Then, implanting boron ions thereto with using a part of the first and second transfer gate electrodes 8 and 9 and photoresist film (not shown) as a mask, removing the photoresist film and applying heat treatment, a P-type guard ring 11 (more clearly shown in FIG. 5A) which is a P-type impurity region is formed around the surface of the first N-type impurity region 2 except the read-out gate region 4 and the vicinity.

Thereafter, as shown in FIG. 6E, the gate oxide film 6a on the first N-type impurity region 2 is selectively removed by wet-etching to form an aperture 12. The shape in plane of the aperture 12 is nearly equal to that of the Schottky electrode 14a in FIG. 5A. Then, by applying the evaporation of platinum in high-vacuum with a pressure of $10^{-4}$ to $10^{-9}$ Pa at room temperature, platinum film 13 with a thickness of a few tenths of a to a few nanometers, for example, 1 nm, as shown in FIG. 6F, is formed. In this step, it is preferable that the vacuum instrument is connected to a vacuum chamber to be available just after forming the aperture 12, i.e., within one hour, and the evaporation is begun after vacuuming. Optionally, it is more preferable that so-called flashing at 800° to 1000° C. for about 10 sec. is carried out in the deposition instrument just before the deposition to remove native oxide film. Then, applying the heat treatment at 300° to 600° C. for about 10 min. in the same vacuum state, the platinum film 13, as shown in FIG. 6G, is converted to PtSi film 14 by the reaction with the silicon substrate where platinum film is directly in contact with. The thickness of the PtSi film 14 is about twice that of the platinum film 13. Then, by removing unreacted platinum by etching with aqua regia, the Schottky electrode 14a in self-alignment with the aperture 12, as shown in FIG. 6H, is formed.

Finally, as shown in FIGS. 5A and 5B, silicon dioxide film 15, metal photoshield film 16, BPSG film (not shown), electrode wiring on the peripheral and passivation film (not shown) are in turn formed, and windows are opened at bonding pads.

The PtSi film formed does not have small islands but rather a smooth plane thereon, and an excellent Schottky barrier is formed between the PtSi film and the silicon substrate. The resistivity of the PtSi film is sufficiently low.

When the impurity concentrations of the P-type semiconductor substrate 1 and the first N-type impurity region 2 are $1 \times 10^{16}$ cm$^{-3}$ and $5 \times 10^{17}$ cm$^{-3}$, respectively, $V_{D1}$, $V_{D2}$ and $\Phi_{SB}$ are 0.769V, 0.811V and 0.84 eV, respectively.

The function of inhibiting blooming due to the solid state image device in the first embodiment will be explained below.

In the initial stage, at the moment when a signal charge is read out from the first N-type impurity region 2 which is a photodiode to the CCD vertical register channel (second N-type impurity region 3), the first N-type impurity region 2 and P-type semiconductor silicon substrate 1 is in the state of reverse bias. However, since the Schottky electrode 14a and channel stopper (P$^+$-type element separating region 5) are connected to each other, the Schottky electrode 14a and P-type semiconductor silicon substrate 1 are kept in the same potential. In this initial stage, Fermi-levels $E_f$ in the Schottky electrode 14a and P-type semiconductor silicon substrate 1 are held as shown in FIG. 5C, and the energy level of the first N-type impurity region 2 is shifted downward. As a charge in the first N-type impurity region 2 is increased by photoelectric conversion, the potential of the first N-type impurity region 2 changes into the energy state as shown in FIG. 5C. If the Schottky electrode 14a does not exist, then charge accumulation due to the photoelectric conversion cause the reverse bias state between first N-type impurity region 2 and the P-type semiconductor silicon substrate 1 to automatically change to the forward bias state as the charge by photoelectric conversion is increased, thereby the diffusion potential being disappeared and the excess charge overflowing into the P-type semiconductor silicon substrate 1 to cause the blooming. Hereon, when the Schottky electrode 14a is formed such that, as shown in FIG. 5C, $V_{D1} < V_{D2}$ is given, the blooming can be inhibited since $V_{D1}$ can be disappeared before $V_{D2}$ is disappeared to overflow the excess charge into the Schottky electrode 14a.

As being apparent from FIG. 5A, in the structure of the solid state image device in this embodiment, an area which may be related to the depletion in the interface between the oxide film and silicon which causes the generation of a dark current is so small, and the Schottky electrode 14a covers nearly the entire surface of the first N-type impurity region 2. Therefore, the dark current can be reduced such as in the second prior art that is provided with the P$^+$ layer as well as the blooming being inhibited thereby.

Though this embodiment employs the P-type guard ring 11, the inhibition of the blooming and the reduction of the dark current is similarly obtained even when the P-type guard ring 11 is not employed. However, when the P-type guard ring 11 is employed, the breakdown voltage in the case that reverse bias is in operation applied between the Schottky electrode 14a and the first N-type impurity region 2 can be enhanced.

Also, the material of the Schottky electrode is not limited to PtSi film and can be optionally changed in accordance with the threshold of overflowing, i.e., the value ($V_{D2}-V_{D1}$) (0.042V in this embodiment). In Table 1, Schottky barrier (referred to as S.B. in Table 1) voltages and formation temperatures in various metal silicides are shown.

TABLE 1

| Metal Silicide | S.B. to N-type Si (eV) | S.B. to P-type Si (eV) | Form. Temp. (°C.) |
| --- | --- | --- | --- |
| CoSi | 0.68 | 0.39 | 400 |
| CoSi$_2$ | 0.64 | 0.43 | 450 |
| CrSi$_2$ | 0.57 | 0.50 | 450 |
| HfSi | 0.53 | 0.54 | 550 |
| IrSi | 0.93 | 0.14 | 300 |
| MnSi | 0.76 | 0.31 | 400 |
| Mn$_{11}$Si$_{10}$ | 0.72 | 0.35 | 800 |
| MoSi$_2$ | 0.55 | 0.52 | 1000 |
| Ni$_2$Si | 0.7–0.75 | 0.32–0.37 | 200 |
| NiSi | 0.66–0.75 | 0.32–0.41 | 400 |
| NiSi$_2$ | 0.7 | 0.37 | 800 |
| Pd$_2$Si | 0.72–0.75 | 0.32–0.35 | 200 |
| PtSi | 0.84 | 0.23 | 300 |
| RhSi | 0.69 | 0.38 | 300 |
| TaSi$_2$ | 0.59 | 0.48 | 750 |
| TiSi$_2$ | 0.60 | 0.47 | 650 |
| WSi$_2$ | 0.65 | 0.42 | 650 |
| ZrSi$_2$ | 0.55 | 0.52 | 600 |

Furthermore, the material of a the Schottky electrode is not limited to the metal silicides and may be of a single metal element. However, in the latter material, the process after depositing has to be carried out under a temperature where the formation of silicide may occur. In any event, the sensitivity of photosensitive devices is not affected since the Schottky electrode can be formed to be sufficiently thin.

Figure 7A:
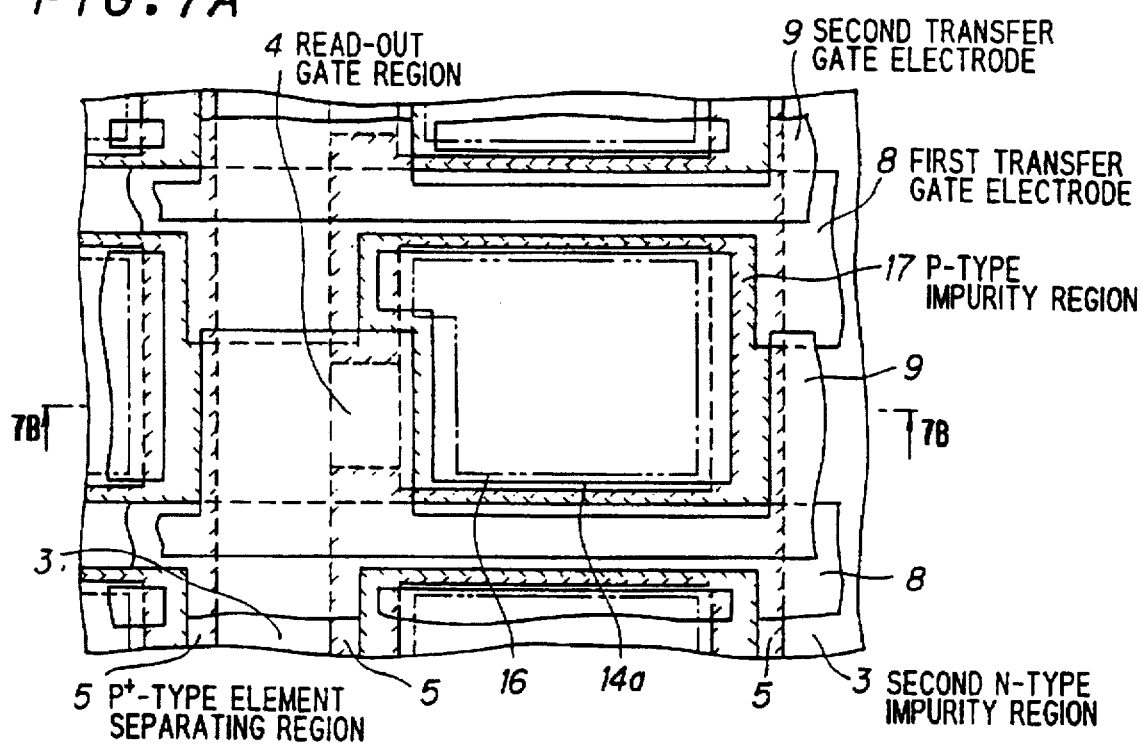
FIG. 7A is a plan view showing a photosensitive device in a second embodiment according to the invention.
Figure 7B:
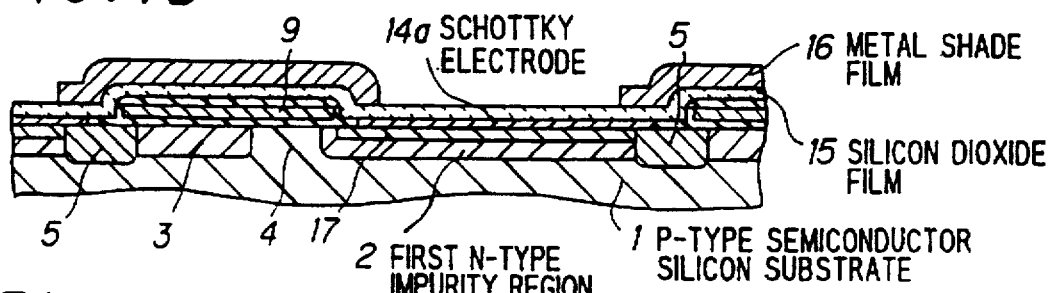
FIG. 7B is a cross sectional view cut along the line 7B—7B in FIG. 7A.
Figure 7C:
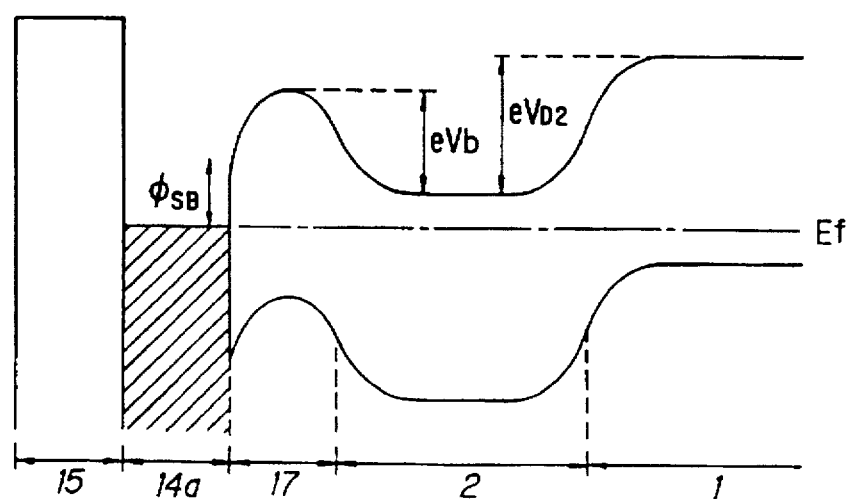
FIG. 7C is an energy band diagram in the direction of the depth of photosensitive device in the second embodiment according to the invention.

A solid state image device in the second preferred embodiment will be explained in reference to FIGS. 7A to 7C. Herein, FIG. 7A is a plan view showing a photosensitive device of the two-dimensional CCD solid state image device. FIG. 7B is a cross sectional view cut along the line 7B—7B in FIG. 7A. FIG. 7C is an energy band diagram in a photosensitive device in the direction of the depth of a substrate.

The second embodiment is different from the first embodiment in that a P-type impurity region 17 is formed on the surface of the first N-type impurity region 2 except a first portion (just under the second transfer gate electrode 9) adjacent to the read-out gate region 4.

A method for making the solid state image device in the second embodiment also employs the steps until the second insulating oxide film 10 is formed as shown in FIG. 6A. Herein, silicon oxide film with a thickness of 65 nm is formed on nearly the entire surface of the first N-type impurity region 2. Then, boron with implantation energy of 20 keV and dose of $1.15 \times 10^{13}$ cm$^{-2}$ is implanted by using the first and second gate electrode 8 and 9, followed by annealing at 900° C. for 5 to 15 min. to form the P-type impurity region 17 with a peak concentration of $8 \times 10^{17}$ cm$^{-3}$ and a junction depth of 50 nm. Though the steps hereinafter are similar to those in the first embodiment, nickel film is formed in place of the platinum film in the first embodiment and then NiSi$_2$ film is formed by the thermal treatment at 800° C. for about 10 min. Unreacted nickel is removed by etching with about 10% dilute nitric acid.

As a result, the Schottky barrier $\Phi_{SB}$ is 0.7 eV and a barrier potential $V_b$ is increased to 0.770V due to the P-type impurity region 17, whereas diffusion potential $V_{D1}$ is 0.629V when the P-type impurity region 17 is not formed.

Since the Schottky barrier has a specific value determined by the material selected as shown in Table 1, the solid image device in the first embodiment can have only a specific threshold in overflowing. In the second embodiment, a band structure in which further potential is added to the Schottky barrier is employed to provide a barrier potential $V_b$ greater than the diffusion potential $V_{D1}$. The increase of potential can be optionally determined by the impurity concentration and thickness of the P-type impurity region 17. Therefore, the degree of freedom in designing of the threshold in overflowing can be improved by the combination of the material of the Schottky electrode and the condition of the impurity addition in the P-type impurity region 17. The P-type impurity region 17 is quite different from the P$^+$ layer in the solid state image device of the second prior art since it is completely depleted as shown in FIG. 7C.

Though the above embodiments are explained as to examples in which the impurity regions are formed on the P-type semiconductor substrate, P-well can be formed on a N-type semiconductor substrate and impurity regions can be formed on the P-well.

Also, the type of conductivity can be reverse. In this case, a suitable material can be selected. Further, the whole structure of the solid state image device is not limited to a specific one and may be similar to that in FIG. 1.

Although the invention has been described with respect to specific embodiments for complete and clear disclosure, the appended claims are not to be thus limited but are to be construed as embodying all modification and alternative constructions that may occur to one skilled in the art which fairly fall within the basic teaching set forth herein.

What is claimed is:

1. A solid state image device, comprising:

a plurality of photosensitive units which are disposed in parallel with each other and each of which includes a row of a plurality of photosensitive devices each of which includes a first N(or P)-type impurity region which is selectively formed on the surface of a P(or N)-type semiconductor region at the surface of a semiconductor substrate, means for executing electronic scanning which is disposed in parallel to said row of photosensitive devices, and a read-out gate in which a signal charge is transferred from said photosensitive devices to said means for executing electronic scanning;

wherein a transparent Schottky electrode is formed on said first N(or P)-type impurity region except a portion adjacent to said read-out gate region, said Schottky electrode is electrically connected to a P$^+$(or N$^+$)-type element separating region which surrounds said first N(or P)-type impurity region and has a Schottky barrier that is formed such that a diffusion potential between said Schottky electrode and said first N(or P)-type impurity region is lower than a diffusion potential between said first N(or P)-type impurity region and said P(or N)-type semiconductor region.

2. A solid state image device, according to claim 1, wherein:

a P(or N)-type guard ring is formed in just under and in the vicinity of an edge portion of said Schottky electrode so that said edge portion of said Schottky electrode is not in contact with said first N(or P)-type impurity region.

3. A solid state image device, comprising:

a plurality of photosensitive units which are disposed in parallel with each other and each of which includes a row of a plurality of photosensitive devices each of which includes a first N(or P)-type impurity region which is selectively formed on the surface of a P(or N)-type semiconductor region at the surface of a semiconductor substrate, means for executing electronic scanning which is disposed in parallel to said row of photosensitive devices, and a read-out gate in which a signal charge is transferred from said photosensitive devices to said means for executing electronic scanning;

wherein a P(or N)-type impurity region is formed on said first N(or P)-type impurity region except a first portion adjacent to said read-out gate region, said P(or N)-type impurity region is connected to a P$^+$(or N$^+$)-type element separating region which surrounds said first N(or P)-type impurity region, and a transparent Schottky electrode is formed on said first N(or P)-type impurity region except a second portion adjacent to said read-out gate region, said second portion being greater than said first portion adjacent to said read-out gate region, said Schottky electrode is electrically connected to said P$^+$(or N$^+$)-type element separating region which surrounds said first N(or P)-type impurity region and has an impurity concentration and thickness in said P(or N)-type impurity region that are formed such that a diffusion potential between said Schottky electrode and said first N(or P)-type impurity region is lower than a diffusion potential between said first N(or P)-type impurity region and said P(or N)-type semiconductor region.

4. A solid state image device, according to claim 1, wherein:

said means for executing electronic scanning is a CCD register which comprises a first channel layer formed by a second N(or P)-type impurity region that is selectively formed on the surface of said P(or N)-type semiconductor substrate, and a plurality of transfer gate electrodes to said respective photosensitive devices which are attached through gate oxide film on said first channel layer, and said read-out gate comprises a second channel layer formed by a semiconductor substrate region between said first channel layer and said first N(or P)-type impurity region, and a read-out gate electrode which is attached through said gate oxide film on said second channel layer.

5. A solid state image device, according to claim 3, wherein:

said means for executing electronic scanning is a CCD register which comprises a first channel layer formed by a second N(or P)-type impurity region that is selectively formed on the surface of said P(or N)-type semiconductor substrate, and a plurality of transfer gate electrodes to said respective photosensitive devices which are attached through gate oxide film on said first channel layer, and said read-out gate comprises a second channel layer formed by a semiconductor substrate region between said first channel layer and said first N(or P)-type impurity region, and a read-out gate electrode which is attached through said gate oxide film on said second channel layer.

6. A solid state image device, according to claim 1, wherein:

said Schottky electrode is metal silicide film.

7. A solid state image device, according to claim 3, wherein:

said Schottky electrode is metal silicide film.

* * * * *